(12) United States Patent
Green et al.

(10) Patent No.: US 9,319,031 B2
(45) Date of Patent: Apr. 19, 2016

(54) HIGH-SPEED CMOS RING VOLTAGE CONTROLLED OSCILLATOR WITH LOW SUPPLY SENSITIVITY

(71) Applicant: THE REGENTS OF THE UNIVERSITY OF CALIFORNIA, Oakland, CA (US)

(72) Inventors: Michael M. Green, Irvine, CA (US); Xiaoyan Gui, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/225,079

(22) Filed: Mar. 25, 2014

(65) Prior Publication Data
US 2014/0292420 A1    Oct. 2, 2014

Related U.S. Application Data

(63) Continuation of application No. 13/236,608, filed on Sep. 19, 2011, now Pat. No. 8,692,622.

(60) Provisional application No. 61/411,529, filed on Nov. 9, 2010, provisional application No. 61/384,092, filed on Sep. 17, 2010.

(51) Int. Cl.
| | | |
|---|---|---|
| H03K 3/03 | (2006.01) | |
| H03K 3/011 | (2006.01) | |
| H03B 5/04 | (2006.01) | |
| H03B 27/00 | (2006.01) | |
| H03L 1/00 | (2006.01) | |

(52) U.S. Cl.
CPC ............... *H03K 3/0322* (2013.01); *H03B 5/04* (2013.01); *H03B 27/00* (2013.01); *H03K 3/011* (2013.01); *H03L 1/00* (2013.01); *H03B 2201/038* (2013.01); *H03B 2202/042* (2013.01)

(58) Field of Classification Search
CPC .... H03B 5/04; H03B 27/00; H03B 2201/038; H03B 2202/042; H03K 3/011; H03K 3/03; H03K 3/0315; H03K 3/0322; H03K 3/354; H03L 1/00
USPC .............. 327/535, 537, 538; 331/57, 74, 115, 331/132, 185, 186
See application file for complete search history.

(56) References Cited

U.S. PATENT DOCUMENTS

| | | | | |
|---|---|---|---|---|
| 5,418,498 A | * | 5/1995 | DeVito et al. .................. | 331/57 |
| 6,037,842 A | * | 3/2000 | Bryan et al. .................... | 331/57 |

(Continued)

OTHER PUBLICATIONS

Gui, X., et al., "Design of CML Ring Oscillators With Low Supply Sensitivity", IEEE Transactions on Circuits and Systems—I: Regular Papers, 2013, vol. 60, No. 7, pp. 1753-1763.

*Primary Examiner* — Levi Gannon
(74) *Attorney, Agent, or Firm* — One LLP

(57) ABSTRACT

High-speed CMOS ring voltage controlled oscillators with low supply sensitivity have been disclosed. According to one embodiment, a CML ring oscillator comprises a CML negative impedance compensation circuit comprising two cross coupled transistors and a resistor connected to the two transistors for resistive biasing and a CML interpolating delay cell connected in parallel with the CML negative impedance compensation. An impedance change of the CML negative impedance compensation due to supply variation counteracts an impedance change of the CML interpolating delay cell.

9 Claims, 10 Drawing Sheets

(56) References Cited

U.S. PATENT DOCUMENTS

| | | | |
|---|---|---|---|
| 6,198,356 B1 * | 3/2001 | Visocchi et al. | 331/34 |
| 6,219,397 B1 * | 4/2001 | Park | 375/376 |
| 6,222,423 B1 * | 4/2001 | Sudjian | 331/57 |
| 6,320,422 B1 * | 11/2001 | Koh | 326/115 |
| 6,670,858 B2 * | 12/2003 | Tang | 331/57 |
| 6,777,994 B2 | 8/2004 | Chou et al. | |
| 6,784,755 B2 | 8/2004 | Lin et al. | |
| 6,911,871 B1 * | 6/2005 | Li et al. | 331/57 |
| 7,057,435 B2 | 6/2006 | Mahanavelu et al. | |
| 7,088,191 B2 * | 8/2006 | Paillet et al. | 331/57 |
| 7,183,864 B1 * | 2/2007 | Gutnik | 331/57 |
| 7,301,409 B2 | 11/2007 | Uchiyama et al. | |
| 7,382,203 B2 | 6/2008 | Kang | |
| 7,683,726 B2 | 3/2010 | Kim | |
| 7,737,795 B2 * | 6/2010 | Rangan et al. | 331/57 |
| 8,207,763 B1 | 6/2012 | In et al. | |
| 2002/0021470 A1 * | 2/2002 | Savoj | 359/158 |

* cited by examiner

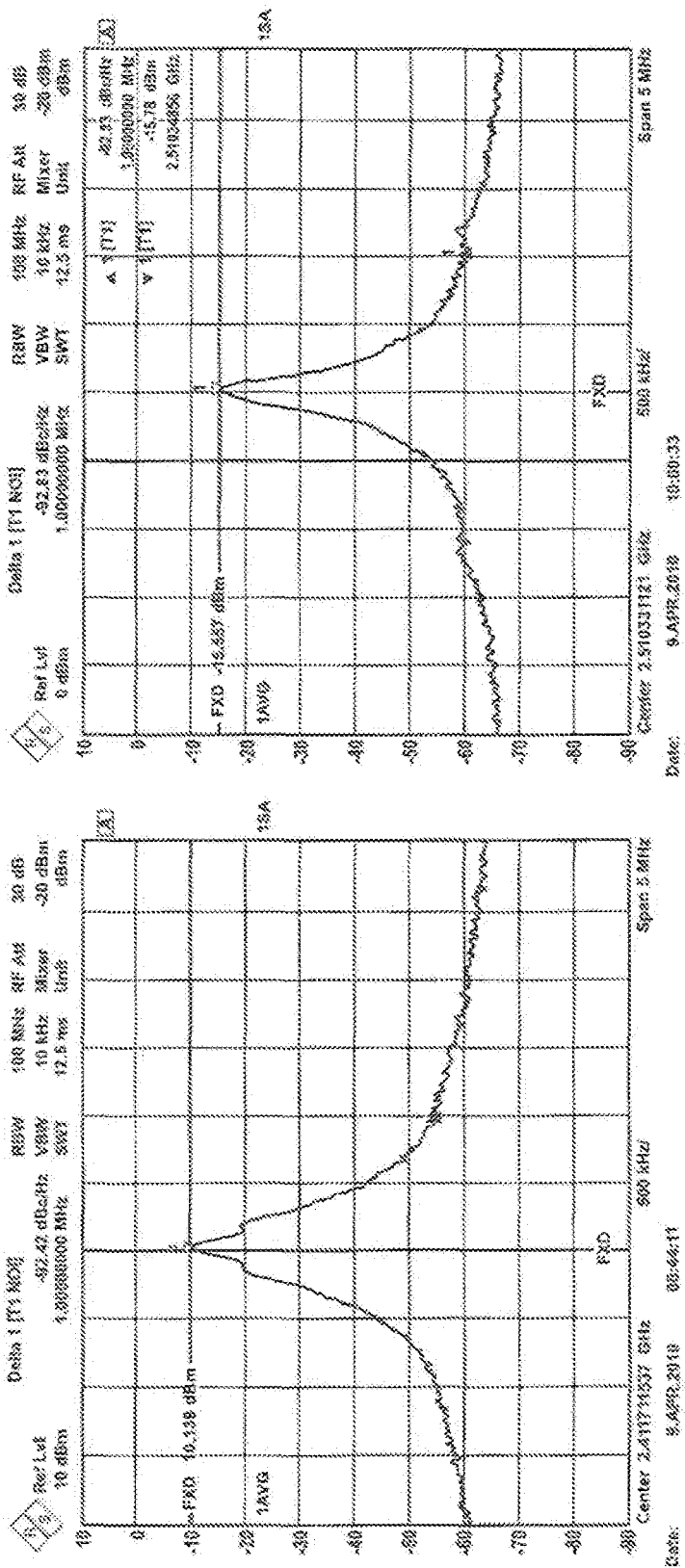

HIGH-SPEED CMOS RING VOLTAGE CONTROLLED OSCILLATOR WITH LOW SUPPLY SENSITIVITY

The present application is a continuation of U.S. application Ser. No. 13/236,608, titled "High-Speed CMOS Ring Voltage Controlled Oscillator with Low Supply Sensitivity" filed on Sep. 19, 2011, which claims the benefit of and priority to U.S. Provisional Application Ser. No. 61/384,092, titled "High-Speed CMOS Ring Voltage Controlled Oscillator with Low Supply Sensitivity" filed on Sep. 17, 2010, and to U.S. Provisional Application Ser. No. 61/411,529, titled "High-Speed CMOS Ring Voltage Controlled Oscillator with Low Supply Sensitivity" filed on Nov. 9, 2010. U.S. Provisional Application Ser. Nos. 61/384,092 and 61/411,529 are hereby incorporated by reference in their entirety.

FIELD

The embodiments described herein generally relate to microelectronic circuits for high-speed communication, and more particularly, to voltage-controlled oscillators with a reduced sensitivity to perturbations in the supply voltage.

BACKGROUND

CMOS IC design of broadband communications components operating at rates of 10 Gb/s and higher are now commonplace and have reached a level of maturity in recent years. However, circuits running at these speeds continue to pose interesting design challenges as the specifications for these circuits become more stringent.

At the heart of any serializer/deserializer chip is the internal high-speed clock that generates the synchronization signal—generally a voltage-controlled oscillator (VCO). In order to maintain proper signal integrity it is imperative that the VCO output exhibit sufficiently low jitter. This jitter arises from both internal noise generation (e.g. random jitter) and disturbances from outside the VCO circuitry (e.g. periodic jitter). Techniques for reducing the random jitter generated by the VCO itself are well known; however, predicting and guarding against external disturbances is a more difficult task. This is exacerbated by the trend to place more circuitry—particularly digital blocks—on a single chip (e.g., SOC), thereby coupling in significant switching noise. The effect of much of the noise coupling from the substrate can be reduced by appropriate layout techniques (e.g. guardbands or use of additional wells), however it is more difficult to reduce the effect of noise coupled directly from the power supply thus making a VCO with high PSRR (power supply rejection ratio) desirable.

Voltage-controlled oscillators (VCO) tend to be sensitive to perturbations in the supply voltage. Such perturbations can cause excess jitter in the VCO output, which increase the bit error-rate of the communication system in which it is implemented.

Using differential signaling techniques (i.e., current mode logic or CML topology) can somewhat weaken this effect.

Attempts to address the sensitivity of VCOs to such perturbations in supply voltage have included employing an additional, dedicated power supply that provides a very clean supply voltage and by adding extra regulator circuitry, such as a low drop-out regulator, which consumes considerable extra power.

SUMMARY

High-speed CMOS ring voltage controlled oscillators with low supply sensitivity have been disclosed. According to one embodiment, a CML ring oscillator comprises a CML negative impedance compensation circuit comprising two cross coupled transistors and a resistor connected to the two transistors for resistive biasing and a CML interpolating delay cell connected in parallel with the CML negative impedance compensation. An impedance change of the CML negative impedance compensation due to supply variation counteracts an impedance change of the CML interpolating delay cell.

The systems, methods, features and advantages of the invention will be or will become apparent to one with skill in the art upon examination of the following figures and detailed description. It is intended that all such additional designs, methods, features and advantages be included within this description, be within the scope of the invention, and be protected by the accompanying claims. It is also intended that the invention is not limited to require the details of the example embodiments.

BRIEF DESCRIPTION

The accompanying drawings, which are included as part of the present specification, illustrate the presently preferred embodiment and, together with the general description given above and the detailed description of the preferred embodiment given below, serve to explain and teach the principles of the present system.

FIG. 9A illustrates a phase noise measurement of an uncompensated VCO for use with the present system, according to one embodiment.

FIG. 9B illustrates a phase noise measurement of a compensated VCO for use with the present system, according to one embodiment.

Figure 1:
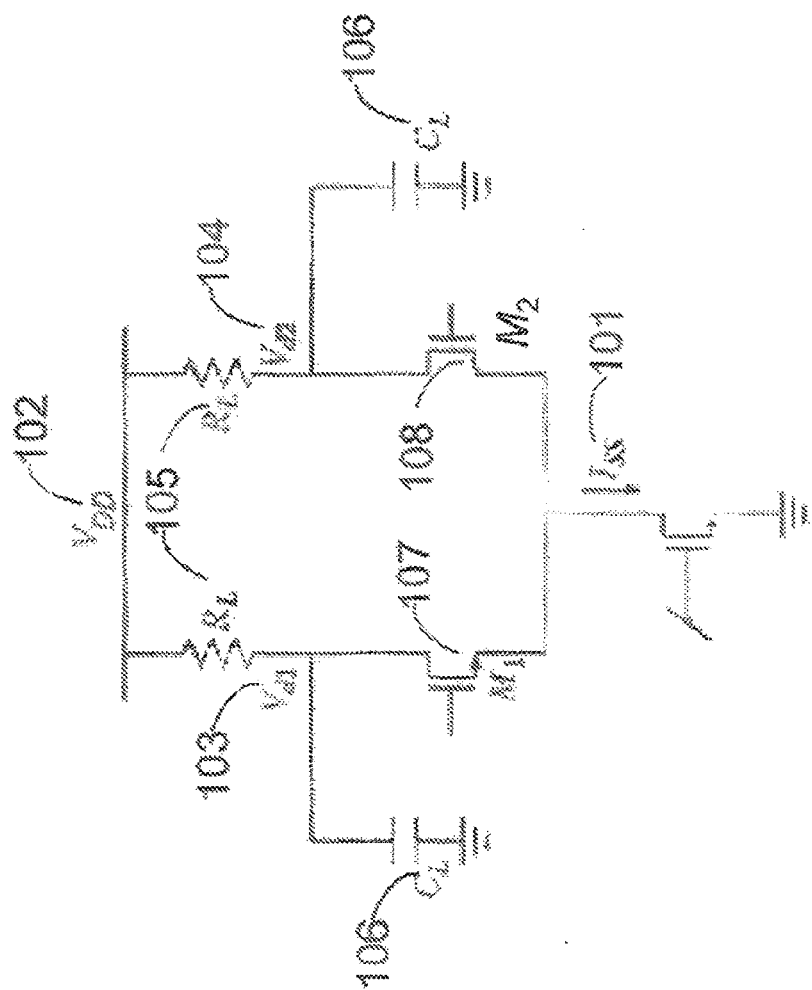
FIG. 1 illustrates a conventional current mode logic (CML) differential pair.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not necessarily describe every aspect of the teachings disclosed herein and do not limit the scope of the claims.

DETAILED DESCRIPTION

High-speed CMOS ring voltage controlled oscillators with low supply sensitivity have been disclosed. According to one embodiment, a CML ring oscillator comprises a CML negative impedance compensation circuit comprising two cross coupled transistors and a resistor connected to the two transistors for resistive biasing and a CML interpolating delay cell connected in parallel with the CML negative impedance compensation. An impedance change of the CML negative impedance compensation due to supply variation counteracts an impedance change of the CML interpolating delay cell.

The present system includes a differential signaling technique for a high-speed VCO based on a ring oscillator. The embodiments provided herein are directed to systems and methods that facilitate the suppression of voltage supply noise-induced periodic jitter and minimize the frequency variation of the VCO by using a novel compensating technique. The embodiments described herein can advantageously be used in many communication IC (integrated circuit) chip products. Any IC chip including a PLL and a CMOS ring oscillator can utilize the embodiments to achieve improved jitter performance without consuming extra power for the regulator circuitry or requiring an additional external connection for a dedicated power supply.

An improved VCO having a reduced sensitivity to perturbations in the supply voltage without requiring a dedicated clean power supply or extra regulator circuitry is disclosed herein.

Effects of Supply Variation on Operation of Conventional Ring Oscillators

FIG. 1 illustrates a conventional current mode logic (CML) differential pair. Both transistors $M_1$ and $M_2$ (107, 108) are assumed to be biased in the saturation region. When current $I_{ss}$ 101 is assumed to be constant, any variation applied to $V_{DD}$ 102 results in nearly the same variation on the drain voltages $V_{d1}$ 103 and $V_{d2}$ 104. The buffer delay time is determined primarily by the RC time constant at the output nodes, given by the equation (utilizing $C_L$ 106 and $R_L$ 105):

$$\tau = (C_L + C_{db1}) \cdot (R_L | r_{o1}).$$

Since the transistor drain-to-bulk capacitance $C_{db1}$ is a depletion capacitance, its value decreases as $V_{d1}$ 103 and $V_{d2}$ 104 increase. Likewise, since $r_{o1}$ models the channel-length modulation, its value also decreases as $V_{d1}$ 103 and $V_{d2}$ 104 increase. Thus both of these effects cause the buffer delay to decrease, and therefore the ring oscillator frequency to increase as $V_{DD}$ 102 increases and vice versa. The result of this effect is illustrated in FIG. 2.

Figure 2:
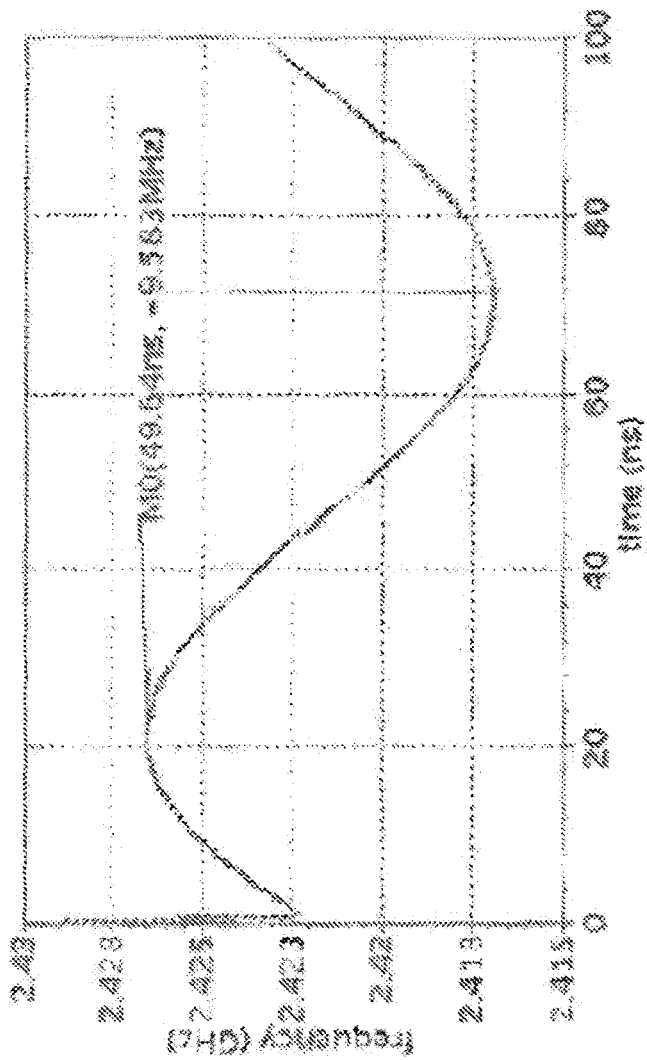
FIG. 2 illustrates frequency variation due to supply variation for a 4-stage ring oscillator.

FIG. 2 illustrates frequency variation due to supply variation for a 4-stage ring oscillator. FIG. 2 illustrates how the frequency of a 4-stage ring oscillator based on the FIG. 1 buffer varies with a 10 MHz, 50 mV p-p supply noise on $V_{DD}$=1.8V.

One of ordinary skill in the art will appreciate that the terms delay cell and buffer are used in the present description interchangeably.

One of ordinary skill in the art will appreciate that the term latch used herein is not necessarily indicative of traditional latch functionality and that functionality of the compensation circuit is described below.

One of ordinary skill in the art will appreciate that while embodiments described herein utilize NMOS transistors, a design including PMOS transistors that provides similar functionality is within the scope of this disclosure.

Supply Compensated Ring Oscillator: Negative Impedance Compensation

According to one embodiment, the present system includes the design of a CML ring oscillator with negative impedance compensation for supply variation. To counteract the effects discussed with regard to FIGS. 1 and 2, circuitry is inserted into each buffer that exerts the opposite effect on the buffer delay. One such circuit that achieves this is a CML negative impedance compensation circuit (also referred to herein as a latch) with resistive biasing which is connected in parallel with the CML buffer outputs, as shown in FIG. 3A.

Figure 3A:
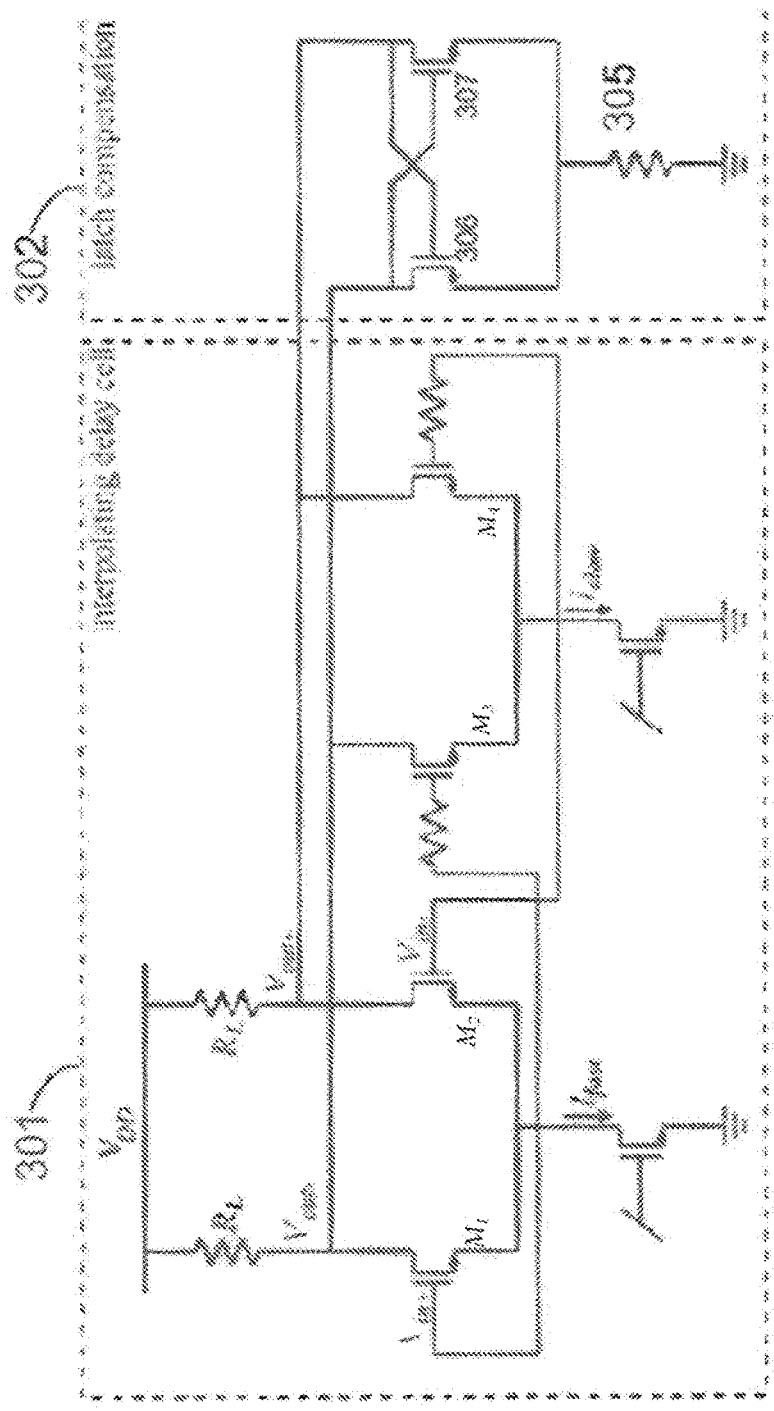
FIG. 3A illustrates an interpolating buffer/delay cell with latch compensation, according to one embodiment.

FIG. 3A illustrates an interpolating buffer/delay cell with negative impedance compensation. A CML interpolating delay cell 301 is connected in parallel with a CML latch 302. The CML latch 302 includes two cross coupled transistors (NMOS in this case) and a resistor for resistive biasing 305. The impedance change of the latch 302 due to supply variation is counteracted by the buffer. If $V_{out+}$ and $V_{out-}$ increase, the tail current of the latch 305 increases, and thus the gm of the latch transistors (306, 307) increases as well. The differential admittance of the latch 302, $-g_m/2$, becomes more negative as $V_{DD}$ increases, thereby increasing the buffer delay. Therefore, this circuit counteracts the effects in the buffer described in FIG. 1.

The impedance change of the latch 302 due to supply variation counteracts the change in impedance due to the buffer itself. The design of the latch 302 can be done in such a way that the transistor sizes and tail currents are both sufficiently small so that the frequency range is not affected by the additional capacitive loading and that the additional power dissipation is small. This technique is limited by the additional noise generated (increasing the random jitter) and capacitive loading that comes from the negative transconductance of the latch.

Figure 3B:
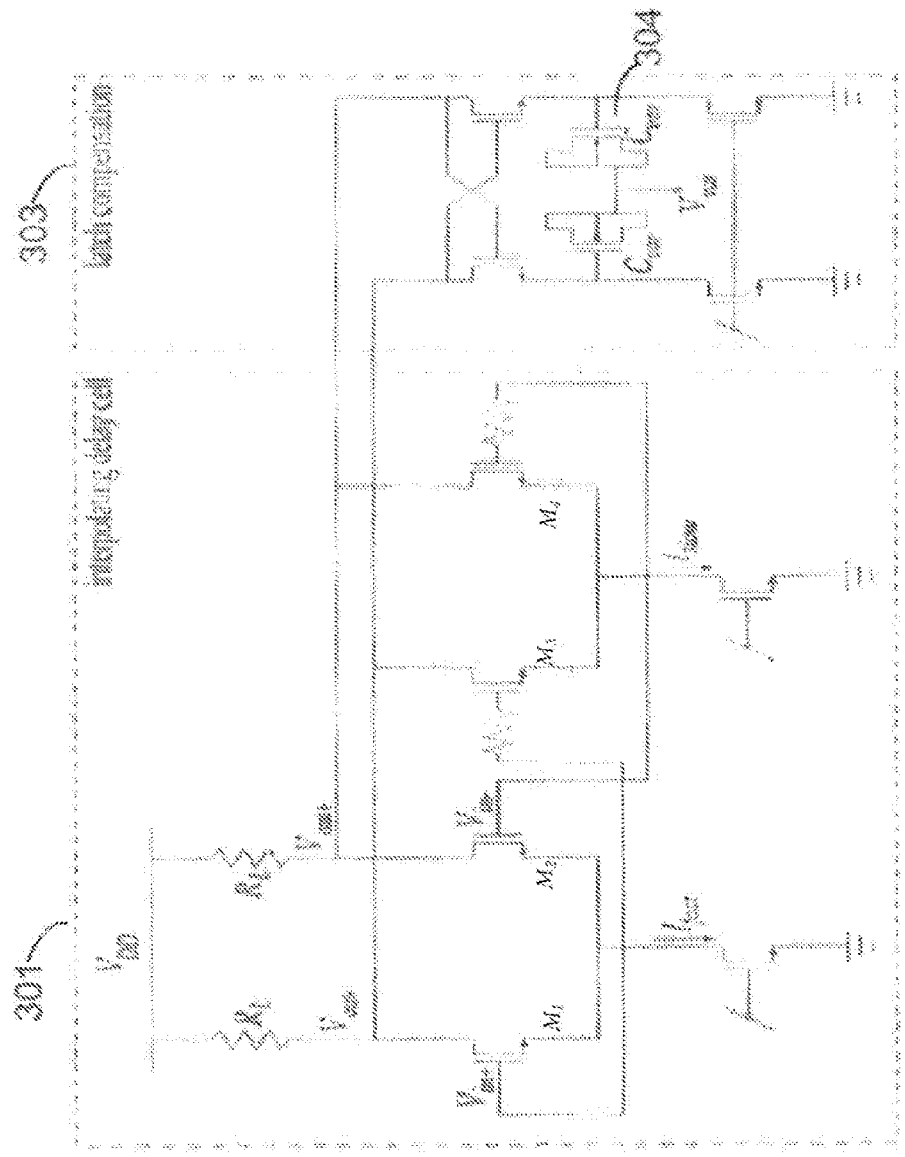
FIG. 3B illustrates an interpolating buffer/delay cell with capacitively generated latch compensation, according to one embodiment.

FIG. 3B illustrates an interpolating buffer/delay cell with capacitively generated latch compensation. A CML interpolating delay cell 301 is connected in parallel with a CML latch 303. Capacitive degeneration 304 is added to the CML latch 303. The capacitive degeneration circuit comprises a second set of two cross coupled transistors and two varactors. The differential admittance for the degenerated latch 303 is given by:

$$Y_{latch} = -\frac{sC_{var}}{2} \cdot \frac{1 - s\frac{C_{gs}}{g_m}}{1 + s\frac{C_{gs} + C_{var}}{g_m}}$$

The above expression can be approximated by:

$$Y_{latch} = -\frac{g_m}{2} \cdot \frac{1}{1 + C_{gs}/C_{var}}$$

for:

$$\frac{g_m}{C_{gs}+C_{var}} << \omega << \frac{g_m}{C_{gs}}$$

As long as the oscillation frequency is within the frequency range stated above, the latch 303 realizes a negative conductance that varies with the value of $C_{var}$. Moreover, the polarity of the varactors shown in FIG. 3B is chosen such that the voltages on the gate terminals of the varactors increase with $V_{DD}$ and therefore so does the value of $C_{var}$. Thus $Y_{latch}$ becomes more negative as $V_{DD}$ increases, thereby counteracting the effect of the supply variation on the buffer itself in a way similar to the FIG. 3A circuit. However, since the admittance of this latch circuit at very low frequencies is very small, the noise generation is much less pronounced at low frequencies—where the phase noise is most important—and thus overall better performance is achieved.

As an example, nominal values chosen for the FIG. 3B compensation circuit can be $C_{gs}$=7.8 fF; $C_{var}$=118.5 fF; gm=1.7 mS. For a 50 mV change in $V_{DD}$, $C_{var}$ increases by 7 fF, which results in a 9 μS increase of the $Y_{latch}$ magnitude. To keep the dc bias current's variation corresponding to supply noise to the minimized extent a $V_t$, reference circuit was used to generate a supply-independent biasing current.

Figure 4:
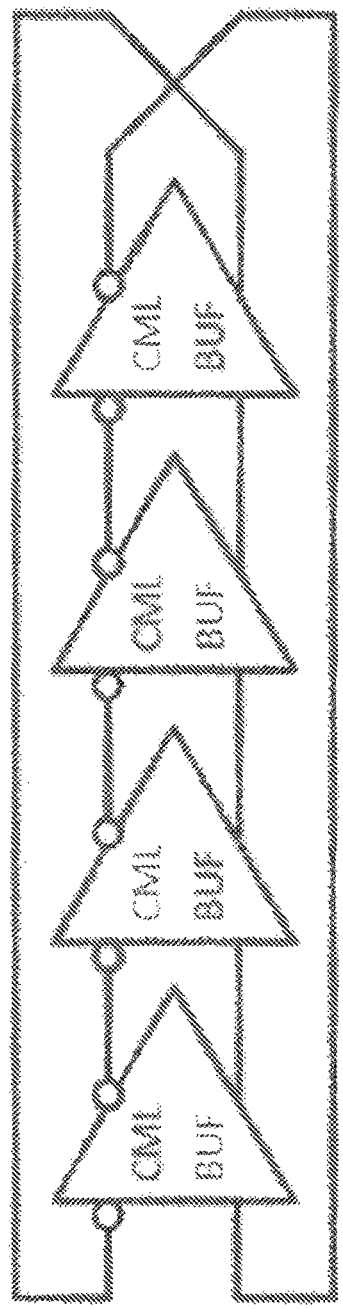
FIG. 4 illustrates an exemplary 4 stage CML oscillator for use with the present system, according to one embodiment.

FIG. 4 illustrates an exemplary 4 stage CML oscillator for use with the present system, according to one embodiment. A plurality of CML buffers are ring connected.

Exemplary Results

Figure 5:
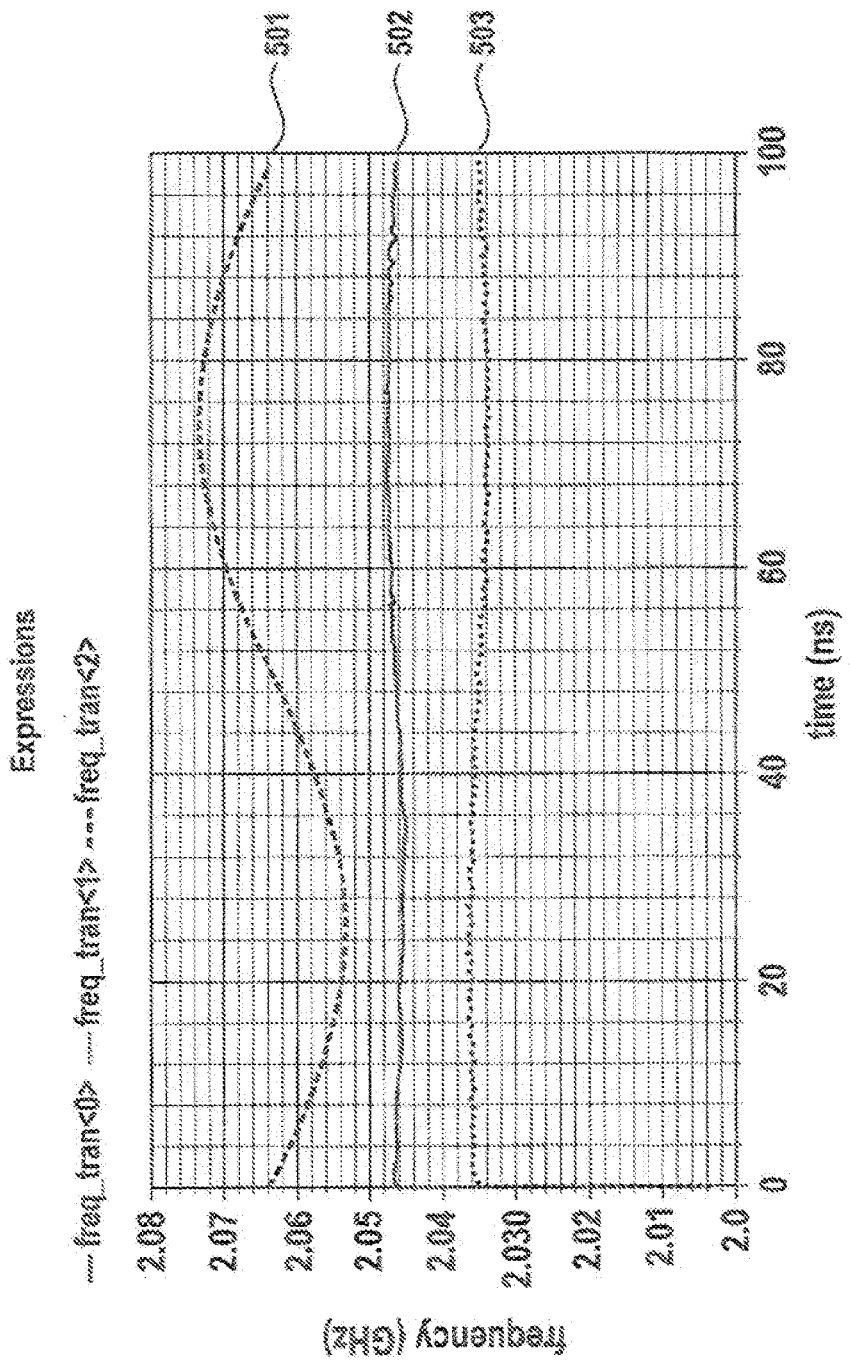
FIG. 5 illustrates frequency variation as a function of compensation strength, according to one embodiment.

FIG. 5 illustrates frequency variation as a function of compensation strength. With varying latch strength (larger size/current or smaller size/current), the compensation strength varies as illustrated in the figure. The signal associated with 503 represents a weak latch and therefore a weak compensation. The signal associated with 501 represents an overcompensated case where the frequency variation due to supply is inverted. The signal associated with 502 represents an ideal compensation.

At low frequencies the admittance of this latch compensation circuit is very close to 0. Therefore the noise generation transformation is much less pronounced at low frequencies, where the phase noise is most important (e.g. at 1 MHz offset), and thus phase noise does not increase compared to the conventional CML ring oscillator.

A test-circuit consisting of two 4-stage CML ring oscillators (one without supply compensation and one with compensation according to FIG. 3B) was simulated and fabricated using the Jazz Semiconductor CA18 0.18 μm CMOS process. The power consumption of each of the oscillators is 10.1 mW using a 1.8V supply voltage. Each VCO has its center frequency near 2.5 GHz and includes a three-stage CML buffer, used to drive the 50Ω off-chip termination, connected to one of the delay stage outputs. To make a fair comparison so as to show the validity of the design, the uncompensated CML ring oscillator was designed to consume the same power, output amplitude and center frequency was used to compare the key specifications.

Figure 6A:
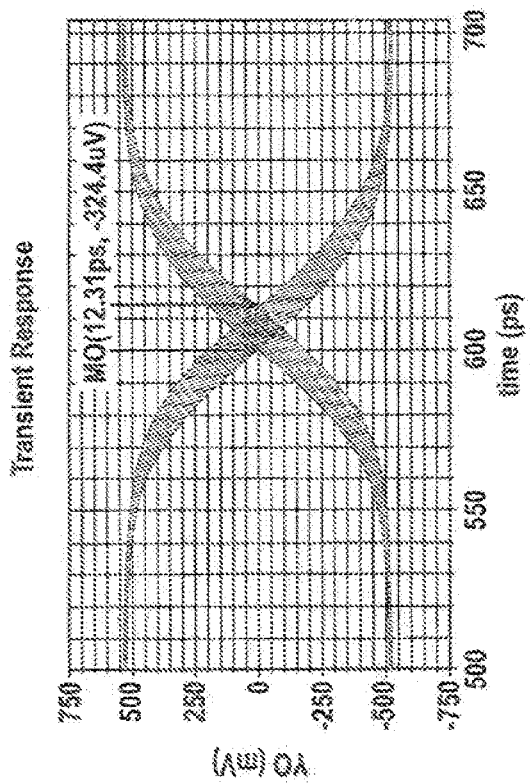
FIG. 6A illustrates periodic jitter of an uncompensated ring oscillator for use with the present system, according to one embodiment.
Figure 6B:
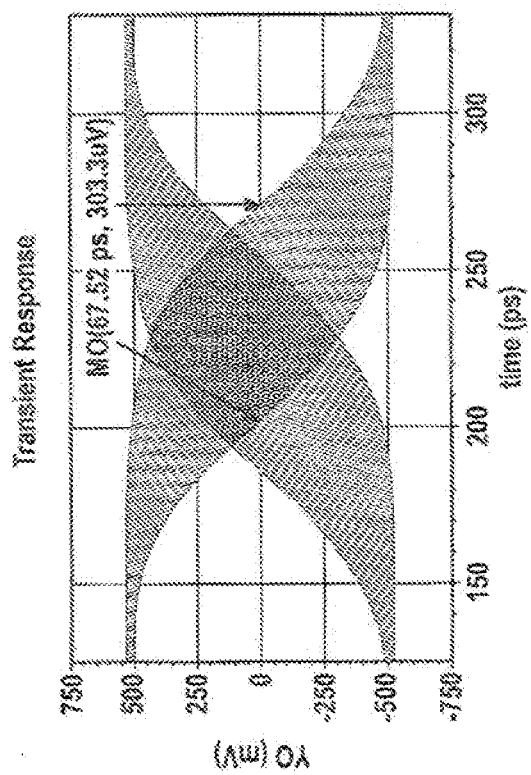
FIG. 6B illustrates periodic jitter of a compensated ring oscillator for use with the present system, according to one embodiment.

Simulated eye diagrams of the two oscillators are illustrated in FIG. 6A (uncompensated) and FIG. 6B (compensated), to quantitatively evaluate the reduction of sinusoidal jitter from a conventional oscillator topology.

At the typical process corner and with the oscillator frequency set to the middle of its range, the conventional ring oscillator (FIG. 6A) exhibits sinusoidal jitter of 67.5 ps, while the compensated oscillator (FIG. 6B) exhibits only 12.3 ps. The simulation results show a reduction in periodic jitter of over 81%.

In the simulations and measurements given here, the varactor bias voltage $V_{var}$ was held constant at 0.6 V, which gave consistent results over temperature from 0 to 125° C. in simulations and oscillation frequency from 2.3 to 2.8 GHz in both simulations and measurements. According to one embodiment, this voltage can be controlled in such a way to optimize the compensation at different process corners.

FIGS. 7A-7D illustrate the power spectra for compensated and uncompensated VCOs at their lowest and highest frequencies. Based on the magnitude of the tones at multiples of 10 MHz away from the oscillation frequencies, the equivalent supply sensitivity indicates a reduction of more than 80% in the worst case (as seen in FIGS. 7A-7D).

Figure 7B:
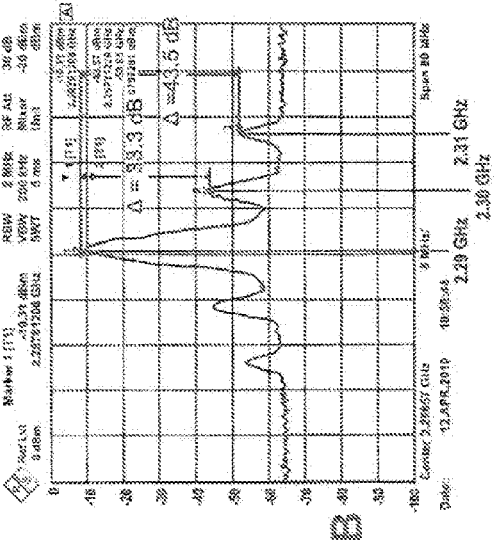
FIG. 7B illustrates an exemplary compensated VCO at 2.30 GHz for use with the present system, according to one embodiment.
Figure 7D:
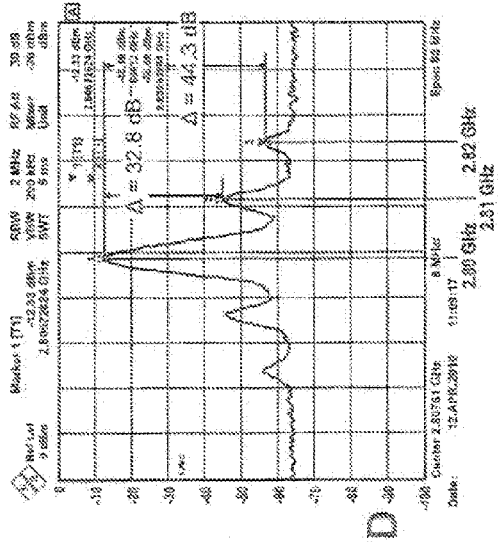
FIG. 7D illustrates an exemplary compensated VCO at 2.81 GHz for use with the present system, according to one embodiment.
Figure 7A:
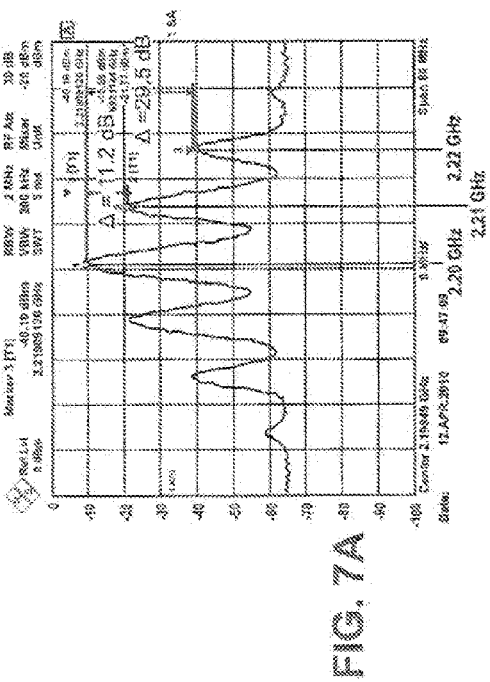
FIG. 7A illustrates an exemplary uncompensated VCO at 2.21 GHz for use with the present system, according to one embodiment.

FIG. 7A illustrates an exemplary uncompensated VCO at 2.21 GHz.

FIG. 7B illustrates an exemplary compensated VCO at 2.30 GHz.

Figure 7C:
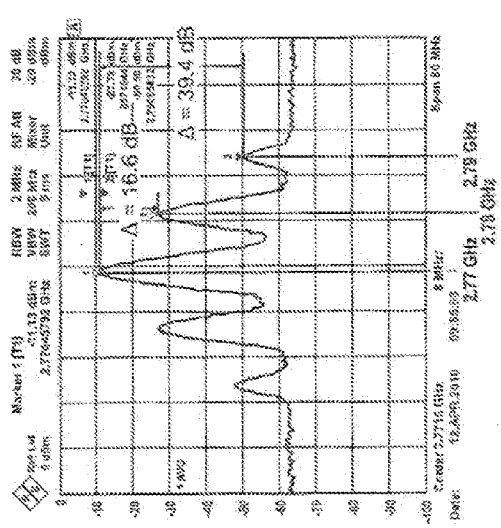
FIG. 7C illustrates an exemplary uncompensated VCO at 2.78 GHz for use with the present system, according to one embodiment.

FIG. 7C illustrates an exemplary uncompensated VCO at 2.78 GHz.

FIG. 7D illustrates an exemplary compensated VCO at 2.81 GHz.

Figure 8:
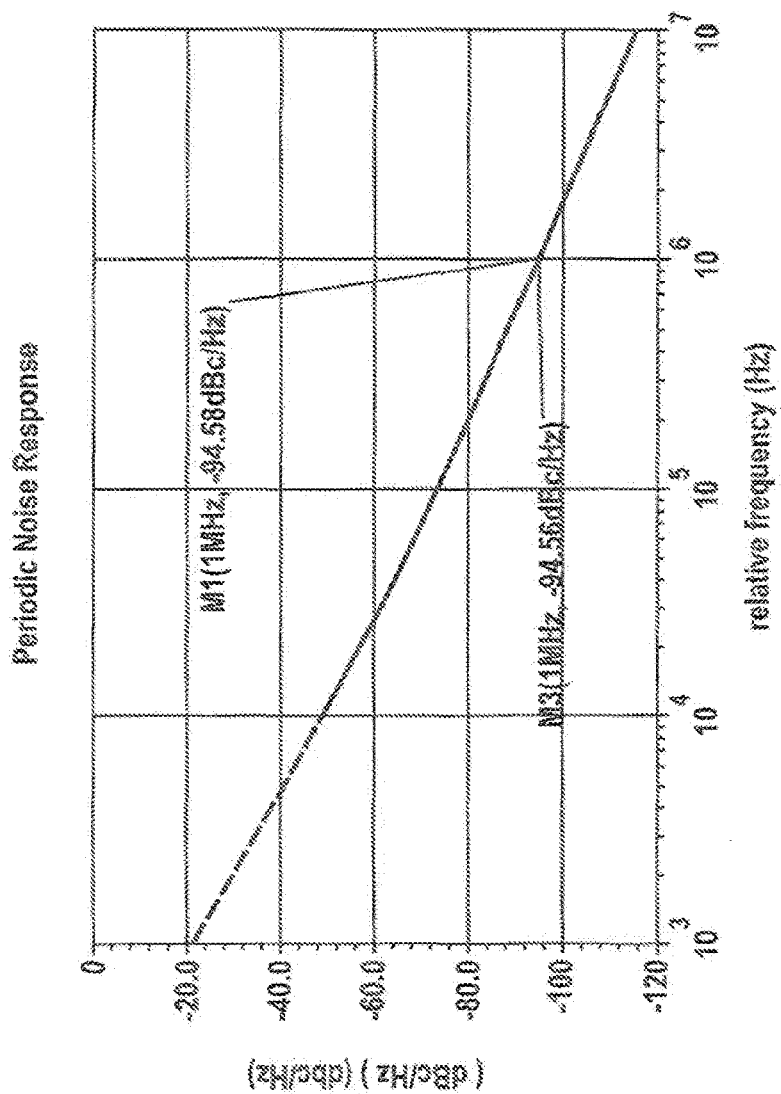
FIG. 8 illustrates phase noise simulation results, according to one embodiment.

FIG. 8 illustrates phase noise simulation results, according to one embodiment. FIG. 8 illustrates that both compensated and uncompensated VCOs have very close phase noise at low frequencies (e.g. at 1 MHz and 10 MHz). Random jitter generation is one of the most important concerns in the design of any VCO in a SER/DES system, and thus should be carefully considered in the design. As mentioned earlier, adding a latch to the delay buffer for compensation as shown in FIG. 3A runs the risk of increasing the phase noise, since the additional transistors generate noise. However, the use of capacitive degeneration in the circuit in FIG. 3B allows the same degree of supply compensation with almost no increase in phase noise. The simulation results shown in FIG. 8 indicate that both with and without compensation the phase noise is −94.6 dBc/Hz at 1 MHz offset frequency. This is confirmed in the measured spectra shown in FIGS. 9A and 9B.

FIGS. 9A and 9B illustrate measured spectra of phase noise at 1 MHz offset of the compensated VCO (FIG. 9B) and uncompensated VCO (FIG. 9A).

In the description above, for purposes of explanation only, specific nomenclature is set forth to provide a thorough understanding of the present disclosure. However, it will be apparent to one skilled in the art that these specific details are not required to practice the teachings of the present disclosure.

The various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter.

High-speed CMOS ring voltage controlled oscillators with low supply sensitivity have been disclosed. It is understood that the embodiments described herein are for the purpose of elucidation and should not be considered limiting the subject matter of the disclosure. Various modifications, uses, substitutions, combinations, improvements, methods of productions without departing from the scope or spirit of the present invention would be evident to a person skilled in the art.

What is claimed is:

1. A current mode logic (CML) ring oscillator comprising:
 a CML negative impedance compensation circuit comprising two cross coupled transistors and a first resistor connected to the two transistors for resistive biasing; and
 a CML interpolating delay cell connected in parallel with the CML negative impedance compensation, the CML interpolating delay cell comprising a first differential pair of transistors and a second differential pair of transistors, wherein a first gate of the first differential pair of transistors is coupled to a second resistor, a second gate of the first differential pair of transistors is coupled to a third resistor, a first gate of the second differential pair of transistors is coupled to the second resistor, and a second gate of the second differential pair of transistors is coupled to the third resistor;
 wherein an impedance change of the CML negative impedance compensation due to supply variation counteracts an impedance change of the CML interpolating delay cell.

2. The CML ring oscillator of claim 1, wherein the CML negative impedance compensation circuit provides compensation for supply variation.

3. The CML ring oscillator of claim 1, wherein the CML interpolating delay cell comprises a first NMOS transistor in parallel with a second NMOS transistor.

4. A method for providing compensation for voltage supply variation, the method comprising:
 supplying voltage to a current mode logic (CML) interpolating delay cell, the CML interpolating delay cell connected in parallel with a CML negative impedance compensation circuit, the CML interpolating delay cell comprising a first differential pair of transistors and a second differential pair of transistors, wherein a first gate of the first differential pair of transistors is coupled to a first resistor, a second gate of the first differential pair of transistors is coupled to a second resistor, a first gate of the second differential pair of transistors is coupled to the first resistor, and a second gate of the second differential pair of transistors is coupled to the second resistor, and
 counteracting an impedance change of the CML negative impedance compensation circuit due to supply variation with an impedance change of the CML interpolating delay cell.

5. The method of claim 4, wherein the CML negative impedance compensation circuit comprises:
 two cross coupled transistors; and
 a third resistor connected to the two transistors for resistive biasing.

6. The method of claim 4, wherein the first differential pair of transistors the CML interpolating delay cell comprises a first transistor in parallel with a second transistor.

7. The method of claim 6, wherein the first and second transistors are NMOS transistors.

8. The method of claim 4, wherein a differential admittance for the CML negative impedance compensation circuit becomes increasingly negative as supply voltage increases.

9. The method of claim 8, wherein the CML negative impedance compensation circuit comprises
 a first set of two cross coupled transistors and
 a capacitive degeneration circuit connected to the first set of two cross coupled transistors for noise reduction, wherein the capacitive degeneration circuit comprises a second set of two cross coupled transistors and two varactors connected to the second set of two cross coupled transistors.

* * * * *